INVENTOR
THOMAS KENNETH LEWIS
BY J. Donald Weber, Jr.
AGENT

United States Patent Office 3,168,654
Patented Feb. 2, 1965

3,168,654

HIGH FREQUENCY PULSE GENERATOR EMPLOYING DIODE EXHIBITING CHARGE STORAGE OR ENHANCEMENT

Thomas Kenneth Lewis, Glenolden, Pa., assignor to Sperry Rand Corporation, New York, N.Y., a corporation of Delaware Filed Nov. 14, 1961, Ser. No. 152,338
5 Claims. (Cl. 307—88.5)

Figure 1:
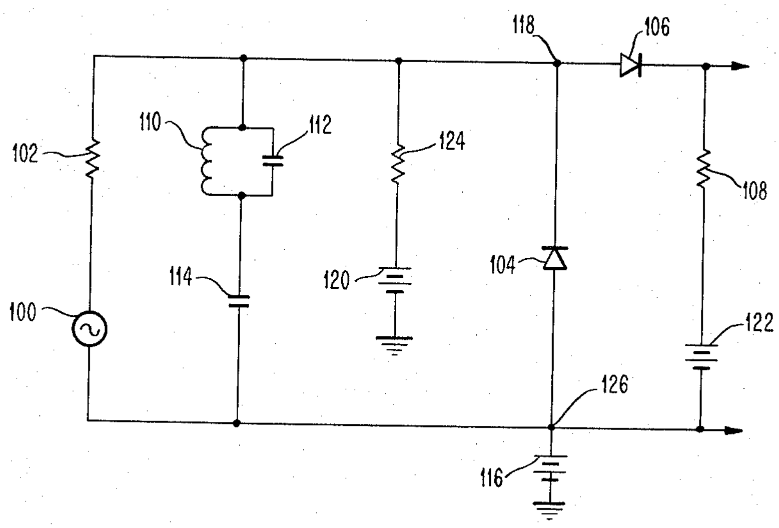

This invention relates to a pulse generator and particularly to a pulse generator having extremely high repetition rates.

The circuit which forms the subject of this invention utilizes a plurality of diodes at least one of which exhibits so-called "enhancement" properties. The enhancement or recombination time properties are normally considered deleterious or disadvantageous in the construction of circuits utilizing diodes. However, by utilizing this property correctly, a diode may be utilized as a "bilateral" switch. That is, the diode will pass current in the forward direction, as usual, and, as well, it will pass current in the reverse direction for a limited time while the excess holes and electrons are recombining in the lattice structure of the diode elements (in a relatively slow process on the order of 25 nanoseconds) or while the minority carriers are being swept out of the base region of the diode (in a relatively fast process on the order of 1 nanosecond). Extremely fast rise-time pulses of extremely high repetition rates may be provided by utilizing the charge storage phenomenon of a diode (exhibited during the recombination) for switching purposes. Thus, the circuit may utilize an input signal which may be of a sinusoidally varying wave-shape for example. Clearly, the input signal need not necessarily be a pure sinusoidal wave but may be any other varying signal and furthermore may be relatively sloppy insofar as wave-shape is concerned. This signal is applied to the enhancement or switching diode to control the potential drop thereacross. At the same time, energy is stored in a tank circuit which is connected in parallel with the switching diode. When the switching diode permits the potential at the other diodes to switch to a predetermined level, the other diodes assume their conductive condition whereby a signal is applied to the load connected in series therewith. The tank circuit is de-energized when the enhanced diode switches thereby applying further energy to the circuit whereby the signal applied to the other diodes is in the form of a relatively flat-top pulse. By varying various parameters in the circuit, the switching time of the diodes can be controlled as well as the height, width, and relative flatness of the output pulses. In addition, spurious outputs which may be produced by overshoots at the trailing edges of the output pulse may be substantially eliminated.

Clearly, an object of this invention is to provide a high frequency pulseformer.

Another object of this invention is to provide a circuit which will operate as a clock pulse source with high repetition rates and extremely fast rise and fall times for the clock pulse.

Another object of this invention is to provide an extremely high frequency pulseformer which is relatively simple in configuration and inexpensive to produce.

Figure 2:
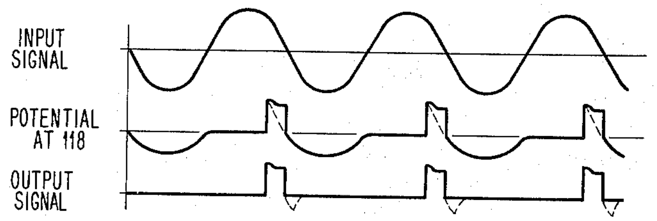

Other objects and advantages of this circuit will become readily apparent subsequent to the reading of the following description which is to be taken in conjunction with the attached drawings, in which:

FIGURE 1 is a schematic drawing of the circuit which is the subject of this invention; and FIGURE 2 is a graphical showing of the waveforms present throughout the circuit.

Referring now to FIGURE 1, it will be seen that an input source 100 is shown as a sinusoidal generator producing a signal of approximately 11 volts peak. Clearly, the input signal source need not be a sinusoidal generator but may be any type of varying signal generator. In fact, the signal may have a rather poor waveshape, but in the preferred embodiment, it is relatively regularly recurring. Moreover, the magnitude of this signal is at least partially determinative of the output energy. In the illustrative example, this energy is of the order of 0.25 watt output. The resistor 102 (10 ohms) is connected to the signal source 100. This resistor 102 may represent the series impedance of the generator 100 or may be, in the alternative, a reactive network as may be required in some preferred circuit operations to reduce power loss. Connected across the circuit branch comprising generator 100 and resistor 102 is a tank circuit. This tank circuit includes an inductor 110 (1.6 microhenries) which is in parallel with capacitor 112 (10 picofarads) which parallel loop is in series with a further capacitor 114 (50 picofarads). The tank circuit is utilized to store energy supplied by the input signal until the output signal is generated (as is discussed subsequently) whereupon a release of the energy from the tank circuit provides a flatter output signal. Also in parallel with the two previous branches, there is connected a diode 104. This diode which may be, for example, a Fairchild Semiconductor FD–100 type diode, is a diode which exhibits enhancement or charge storage (recombination) properties. These properties are essential to the operation of the circuit, but may be varied in accordance with the desired frequency of operation of the pulseformer as well as the pulse duration of the output signal. Moreover, different power requirements may dictate the utilization of different diode types. A further parallel branch is connected to the circuit and includes diode 106 and load 108. The load 108 is schematically shown as a resistor of about 100 ohms, for example; however, it should be understood that such a resistive load is not necessarily the extent of the scope of this invention. The diode 106 may also be an FD–100 type diode and may also exhibit some recombination characteristics in some cases. However, it is preferred that this diode should not exhibit extensive recombination or enhancement properties. Furthermore, the diode 106 is connected to the circuit such that the polarity thereof is opposite to that of the diode 104. Thus, diode 106 is conductive only when diode 104 is non-conductive and vice-versa. This condition will be more fully understood with a description of the operation of the circuit in conjunction with FIGURE 2. A bias source, shown for example as battery 116, is connected to the lower node 126 of the parallel circuit which comprises the pulse generator. This bias source is utilized to shift (as may be necessary) the reference level of the input signal such that the diode 104 can be more readily rendered conductive or the output levels shifted by the application of the input signal. A further source for example, battery 120 may be connected to terminal 118 via resistor 124 (500 ohms). This source is utilized to control the current flow through diode 104 as described subsequently and the polarity thereof is determined by the preferred utilization. Moreover, source 120 controls the pulse width by controlling the current flow through diode 106. Typically source 120 may be variable between 0 and +30 volts whereby the pulse width (at the 50% pulse point) varies between about 5.5 and 7.0 nanoseconds. A source, for example, battery 122 may be connected in series with diode 106. The polarity of this battery is preferably such that the diode 106 is more definitely back-biased whereby the leading edge of the pulse produced thereby is rendered steeper. That is, by applying a reverse potential on the order of +1.0 volt, diode 106 will not conduct until the input pulse applied thereto (see FIGURE 2) has reached the steep leading edge. The choice of batteries 116, 120 and 122 are not crucial to the circuit operation and may have any desired potential and may, in some cases, even be omitted. Clearly, of course, the suggested component values are exemplary only and do not, in and of themselves, form a part of the invention.

For higher power application, the component examples supra may be altered. For example, in an 8 watt output application, source 100 will provide a 30 volt peak-to-peak signal and diodes 104 and 106 will be replaced by Microwave Associates MA4286 diodes. The theory of operation is, of course, substantially identical but the altered components are better adapted for high power applications.

The operation of the circuit shown in FIGURE 1 is now described with reference to the waveforms shown in FIGURE 2. The input signal supplied by generator 100 is shown, for purposes of example, as a sinusoidally varying signal. This signal varies around the reference level which is determined by the potential supplied by battery 116. As described supra, if the battery 116 is omitted the reference potential would normally be zero or ground. In the alternative however, the reference potential may be some potential value which is different from ground. The input signal is supplied to the other parallel branches of the pulse generator network by the generator 100. Thus, it will be seen that the potential at terminal 118 is as shown in FIGURE 2. That is, when the signal supplied by generator 100 is negative going, diode 104 is rendered conductive in the forward direction whereby the potential at terminal 118 effectively follows the input signal waveform and the potential at terminal 118 also effects a negative going signal. Moreover, source 120 tends to control the forward current flow through the diode 104 whereby the recombination time and, therefore, the pulse width of the reverse current signal is controlled. At the same time of course, energy is being stored in the tank circuit comprising inductor 110 and capacitors 112 and 114. With the reversal of the polarity of the signal supplied by the input source, the potential at terminal 118 would normally tend to try to follow the input signal waveform and, thereby, go positive. This normal operation would be such that the diode 104 would be reverse-biased and cut off. However, because of the charge storage characteristic or property of the diode, effective reverse current can flow through the diode 104 for about 6 nanoseconds. This current flow exists during the time when the excess holes and electrons are recombining or being swept out of the base region. When the recombination has been completed, the diode 104 becomes, ideally, back-biased. There is, of course, a certain amount of capacitance in the diode; however, this capacitance is relatively negligible. As soon as the diode 104 is rendered cut off by being back-biased, the potential at terminal 118 almost instantaneously rises to the potential being applied by the input signal. Clearly, this switching can take place in an extremely short time and the circuit has been demonstrated to be capable of sub-nanosecond switching. Actual switching times on the order of 1 nansecond have been measured. As soon as the potential at 118 becomes sufficiently positive to overcome the reverse bias of source 122 the diode 106 is forward biased and begins to conduct. The signal passed by diode 106 is virtually identical to the signal presented at terminal 118. This signal is then presented to load 108 for utilization thereby.

As previously described, the tank circuit comprising inductors and capacitors has stored energy during the preceding signal application of the input signal. When the diode 104 switches to the cut off condition, energy is discharged by the tank circuit into the remaining parallel circuitry. Thus, energy is supplied via terminal 118 through diode 106 to the load 108. The application of this additional energy tends to produce a relatively flat-top signal through diode 106. In other words, without the tank circuit in the pulseformer the potential at terminal 118 would tend to vary as suggested by the dashed line in FIGURE 2. That is, the potential at terminal 118 would follow the waveform of the input signal. However, in view of the additional energy supplied by the tank circuit, the signal applied to diode 106 produces the relatively square pulse shape shown in FIGURE 2.

Once again, after the input signal has crossed from the positive into the negative going region, a negative pulse is exhibited at terminal 118 because of the forward biasing and conduction of diode 104. It will be clear that the output signal is that shown in FIGURE 2 inasmuch as the application of the negative input signal at terminal 118, in conjunction with source 122, will back-bias diode 106 thereby rendering that diode nonconductive. Consequently, the output signal will be non-existent until the pulse generated by the switching of diode 104 is passed through diode 106.

It will be seen, that this circuit provides an output signal having a relatively square-shaped pulse. This pulse has extremely fast rise times and extremely fast fall times. Moreover, this circuit is capable of operation at frequencies greater than 40 megacycles per second. The minimum repetition rate is relatively high, but may be on the order of 10,000 cycles per second. An upper limit for the repetition rate has not yet been determined but is dependent only upon the components available.

The embodiment of the invention shown is illustrative only and represents a preferred embodiment for a high frequency pulseformer. It is clear that the components shown and described are exemplary and are not limitative of the inventive concepts of the invention. Certain changes in the circuit may be suggested to those skilled in the art in order to provide certain changes in the operation thereof. For example the tank circuit may be changed from parallel to series, or otherwise, whereby either a flatter or a less flat-top signal may be obtained. Furthermore, the parameters of the various components may be changed in order to obtain desired power operations without departing from the principles and scope of the invention.

Having thus described preferred embodiments of the invention, what is claimed is:

1. A pulse generator comprising,
a sinusoidal input source,
a tank circuit connected in parallel with said source for storing energy therein,
selectively bilaterally conducting means connected in parallel with said source,
said bilaterally conducting means operative to conduct current in a first direction during one half cycle of an input signal and to further conduct current in the opposite direction during a portion of the opposite half-cycle of said input signal,
said further conduction being characterized by the recombination of minority charge carriers in said bilaterally conducting means,
a unilaterally conducting device connected to said bilaterally conducting means and which is reverse biased and non-conducting when said bilaterally conducting means is conducting and which conducts when said bilaterally conducting device is not conducting,
said tank circuit operative to supply energy when said unilaterally conducting device conducts,
and output means for receiving the energy signal supplied by said unilaterally conducting device.

2. A pulse generator comprising,
a sinusoidal input source, a tank circuit connected in parallel with said source for storing energy, a first semiconductor device exhibiting recombination characteristics connected in parallel with said source and said tank circuit, said first semiconductor operative to conduct current in a first direction during one half cycle of an input signal and to further conduct current in a second direction during the opposite half-cycle of said input signal while said semiconductor exhibits said recombination characteristics, and a second semiconductor connected to said first semiconductor and which is reverse biased when said first semiconductor is conducting and conducts when said first semiconductor is not conducting, said tank circuit operative to supply energy when said second semiconductor conducts thereby to provide a substantially rectangular energy signal.

3. A pulse generator comprising, a sinusoidal input signal source, a tank circuit in parallel with said source for storing energy therein during one half-cycle of an input signal, a first diode exhibiting recombination characteristics connected in shunt arrangement across said input source, said first diode operative to conduct current in a first direction during said one half-cycle of an input signal and to further conduct current in a second direction during only a portion of the opposite half-cycle of said input signal while said first diode exhibits said recombination characteristics, a second diode connected to said first diode, said second diode being reverse biased only when said first diode is conducting and being conductive such that current is passed therethrough when said first diode is non-conducting, said tank circuit supplying energy in the form of current only when said second diode conducts, and output means connected to said second diode for receiving current when said second diode conducts.

4. In combination, means for producing an alternating input signal, a circuit exhibiting energy storage capabilities, said circuit connected to said means for producing an input signal, a first diode, said first diode connected across said input means and characterized by stored charge characteristics, said first diode exhibiting current conduction in the forward direction such that charge is stored therein when forward biased and current conduction in the reverse direction only during the recombination of stored charge when reverse biased, a second diode connected to said first diode and which conducts only when said first diode is not conducting, output means, said second diode connected in series with said output means such that an output signal is supplied from said means for producing an input signal to said output means via said second diode only in response to the conduction of said second diode, said output signal having the shape thereof altered by the release of energy stored in said energy storage circuit such that the output signal shape does not conform to that of the input signal, and a plurality of potential sources for regulating the reference levels of said signals.

5. In combination, means for producing an alternating input signal having a substantially sinusoidal waveshape, a reactive network exhibiting energy storage capabilities, a first diode, said reactive network connected to said means for producing an input signal and said first diode, said first diode connected in shunt across said input means and characterized by stored charge characteristics, said first diode exhibiting forward current conduction such that charge is stored therein when forward biased and reverse current conduction only during the recombination of stored charge when reverse biased, said first diode being nonconducting only when reverse biased in the absence of stored charge therein, a second diode connected to said first diode in head-to-tail relationship and which conducts only when said first diode is nonconducting, and output means, said second diode connected in series with said output means such that an output signal is supplied to said output means from said means for producing an input signal via said second diode only in response to the conduction of said second diode, said output signal having the shape thereof altered by the release of energy previously stored in said reactive network such that the signal shape does not conform to that of the input signal.

References Cited in the file of this patent

UNITED STATES PATENTS

| | | |
|---|---|---|
| 2,755,441 | Gulnac | July 17, 1956 |
| 2,760,068 | Feagin | Aug. 21, 1956 |
| 3,020,420 | Smee | Feb. 6, 1962 |

OTHER REFERENCES

Germanium Crystal Diodes, Sylvania Electric Application Notes (page 7).